(12) United States Patent
Martin et al.

(10) Patent No.: US 10,197,909 B2
(45) Date of Patent: Feb. 5, 2019

(54) METHOD OF REDUCING SHOT COUNT IN DIRECT WRITING BY A PARTICLE OR PHOTON BEAM

(71) Applicant: ASELTA NANOGRAPHICS, Grenoble (FR)

(72) Inventors: Luc Martin, Saint Egreve (FR); Thomas Quaglio, Grenoble (FR); Matthieu Millequant, Tullins (FR); Clyde Browning, Grenoble (FR); Serdar Manakli, Meyrie (FR)

( * ) Notice: Subject to any disclaimer, the term of this patent is extended or adjusted under 35 U.S.C. 154(b) by 0 days.

(21) Appl. No.: 15/286,260

(22) Filed: Oct. 5, 2016

(65) Prior Publication Data

US 2017/0097571 A1    Apr. 6, 2017

(30) Foreign Application Priority Data

Oct. 6, 2015    (EP) ..................... 15306576

(51) Int. Cl.
*G03B 27/42*    (2006.01)
*G03F 1/78*    (2012.01)
(Continued)

(52) U.S. Cl.
CPC ............... *G03F 1/78* (2013.01); *G03F 7/705* (2013.01); *G03F 7/70383* (2013.01);
(Continued)

(58) Field of Classification Search
CPC ............ G06F 17/5081; G06F 17/5072; G06F 17/5068; G06F 2217/04; G06F 17/50; G06F 2217/64; G03F 1/72; G03F 7/70383; G03F 7/11; H01J 37/3174; H01J 37/045; H01J 2237/31764; H01J 2237/31776

See application file for complete search history.

(56) References Cited

U.S. PATENT DOCUMENTS

2006/0085773 A1    4/2006    Zhang
2008/0189673 A1*   8/2008    Ying .................. G03F 1/36
                                                716/52

(Continued)

OTHER PUBLICATIONS

J. Word et al., "Mask shot count reduction strategies in the OPC flow," Optomechatronic Micro/Nano Devices and Components III: Oct. 8-10, 2007, vol. 7028, Apr. 18, 2008, pp. 1-11, XP002511353.

(Continued)

*Primary Examiner* — Mesfin Asfaw
(74) *Attorney, Agent, or Firm* — Baker & Hostetler LLP

(57) ABSTRACT

A method for transferring a fractured pattern decomposed into elementary shapes, onto a substrate by direct writing by a particle or photon beam, comprises a step of identifying at least one elementary shape of the fractured pattern, called removable elementary shape, whose removal induces modifications of the transferred pattern within a preset tolerance envelope; a step of removing the removable shape or shapes from the fractured pattern to obtain a modified fractured pattern; and an exposure step, comprising exposing the substrate to a plurality of shots of a shaped particle or photon beam, each shot corresponding to an elementary shape of the modified fractured pattern. A computer program product for carrying out such a method is provided.

16 Claims, 5 Drawing Sheets

(51) Int. Cl.
*G03F 7/20* (2006.01)
*H01J 37/302* (2006.01)
*H01J 37/317* (2006.01)

(52) U.S. Cl.
CPC ...... *G03F 7/70433* (2013.01); *G03F 7/70441* (2013.01); *G03F 7/70491* (2013.01); *H01J 37/3026* (2013.01); *H01J 37/3174* (2013.01); *H01J 37/3178* (2013.01); *H01J 2237/3175* (2013.01)

(56) References Cited

U.S. PATENT DOCUMENTS

| | | |
|---|---|---|
| 2009/0070732 A1 | 3/2009 | Sahouria et al. |
| 2012/0084740 A1 | 4/2012 | Fujimura et al. |
| 2012/0272195 A1* | 10/2012 | Hsuan ................ G03F 1/36 716/53 |
| 2012/0329289 A1 | 12/2012 | Fujimura et al. |
| 2014/0245240 A1 | 8/2014 | Tiphine et al. |
| 2015/0040083 A1 | 2/2015 | Cheng et al. |

OTHER PUBLICATIONS

A. Elayat et al., "Assessment and comparison of different approaches for mask write time reduction," Photomask Technology 2011, SPIE, vol. 8166, No. 1, Nov. 3, 2011, pp. 1-13, XP060021599.

Fujimoto Yoshihiro et al., "An extraction of repeating patterns from OPCed layout data," SPIE, vol. 6925, 2008, pp. Y1-Y8, XP040435910.

G. S. Chua et al., "Optimization of mask shot count using MB-MDP and lithography simulation," Photomask Technology 2011, Proc. of SPIE, vol. 8166, pp. 1-11.

* cited by examiner

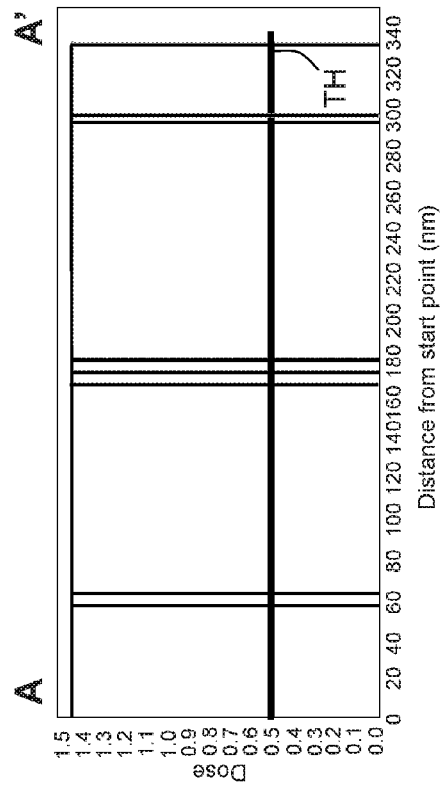
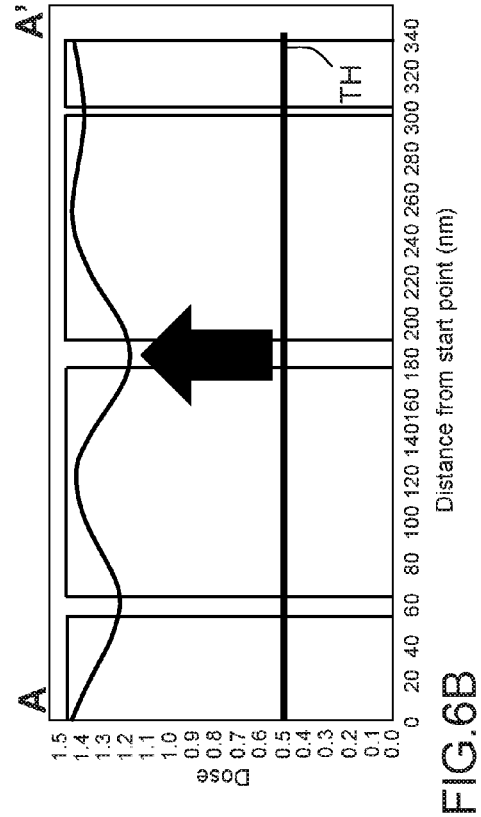
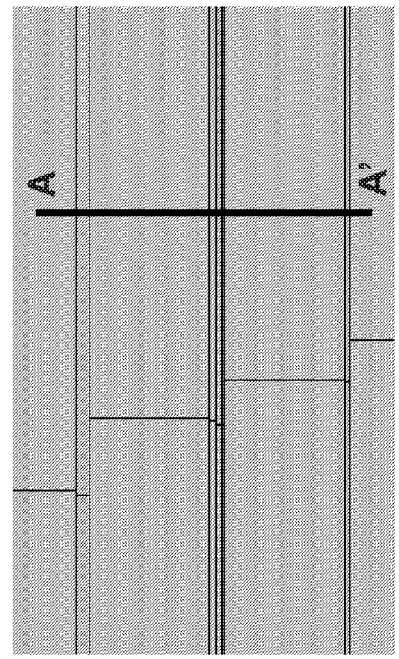
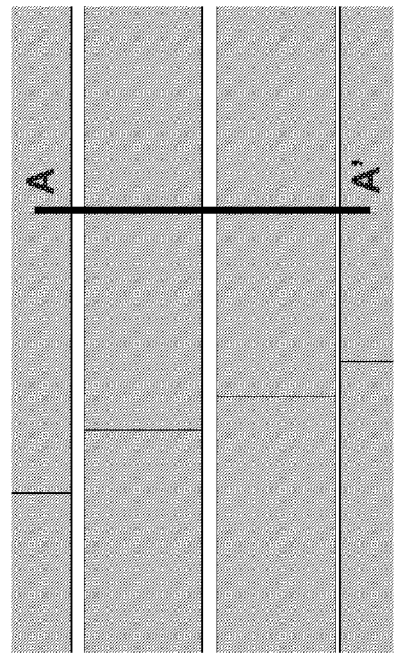
FIG.6A
FIG.6B

METHOD OF REDUCING SHOT COUNT IN DIRECT WRITING BY A PARTICLE OR PHOTON BEAM

CROSS-REFERENCE TO RELATED APPLICATIONS

This application claims priority to foreign European patent application No. EP 15306576.8, filed on Oct. 6, 2015, the disclosure of which is incorporated by reference in its entirety.

FIELD OF THE INVENTION

The invention relates to the field of micro- and nano-manufacturing, and in particular to that of direct-writing (or "maskless") lithography, such as electron beam lithography (EBL). More precisely, the invention relates to a method for transferring a pattern onto a substrate by direct writing by means of a shaped particle or photon beam, and also to a computer program product for carrying out such a method.

BACKGROUND

Electron beam lithography is the most commonly used technique for performing direct writing—or maskless—lithography. It allows achieving a spatial resolution of a few tens of nanometers or less, and is particularly well suited for manufacturing photolithography masks.

FIG. 1 is a schematic illustration of an electron-beam lithography apparatus known from prior art. On this figure, reference 11 corresponds to a substrate—e.g. a silicon wafer or a glass or silica plate—onto which a pattern has to be transferred by direct writing lithography, reference 12 to a resist layer deposited on a surface of said substrate (the term "substrate" will be used indifferently to designate the bare substrate 11 or the ensemble 10 including the resist layer), reference 20 to an electron beam source, reference 21 to an electron beam generated by said source and impinging onto the resist layer 11, reference 30 to an actuation stage for translating the substrate 10 with respect to the electron beam 20, reference 40 to a computer or processor driving the electron beam source 20 and the actuation stage 30, and reference 41 to a computer memory device storing a program executed by said computer or processor 40. The electron beam source 20 and the actuation stage 30 cooperate for selectively exposing to the electron beam specific regions of the substrate, according to a predetermined pattern. Actually the spatial distribution of the energy deposited onto the substrate (the "dose") does not accurately match the predetermined pattern; this is mainly due to the finite width of the electron beam and to the forward- and back-scattering resulting from the interactions of the electrons with the resist and the substrate ("proximity effects").

Then, during a so-called development step, the exposed area (for positive resist) or the unexposed area (for negative resist) is selectively eliminated, so that the remaining resist approximately reproduces the predetermined pattern or its complement on the surface of the substrate. Afterwards, the portion of the surface of the substrate which is not covered by resist can be etched, and then the remaining resist eliminated. In different embodiments, the etching may be replaced by the implantation of a dopant, a deposition of matter etc.

Electron beam 21 may be a narrow circular beam, in which case the pattern is projected onto the resist point by point, using raster or vector scanning. In industrial applications, however, it is often preferred to use "shaped beams", which are larger and typically have a rectangular or triangular section. In this case, before being transferred, the pattern is "fractured"—i.e. is decomposed into a plurality of elementary shapes which can be transferred by a single shot with a significant acceleration of the process.

When shaped beams are used, the number of shots—and therefore the number of elementary shapes which define the pattern—is the main factor determining the writing time, and therefore the cost of the process. Unfortunately, fractured patterns often comprise a significant number of elementary shapes, leading to long and expensive writing operations. Moreover, some of these elementary shapes may be smaller than the resolution of the direct writing process, and therefore impossible to reproduce accurately. This is particularly true for the writing of advanced photolithography masks, involving OPC (Optical Proximity Correction) treatments that may result in highly fragmented patterns. Several techniques have been developed in order to reduce the number of shots in direct writing using shaped particle or photon beams; a review is provided by the paper "Assessment and comparison of different approaches for mask write time reduction," A. Elayat, T. Lin, S. F. Schulze, Proc. of SPIE, Vol. 8166, 816634-1-816634-13.

A first possibility consists in optimizing the fracturing step without modifying the pattern, but this only leads to a limited reduction of the shot count.

Better results may be obtained, but at a much greater computational cost, by allowing overlapping and non-abutting shots—i.e. by allowing that the fractured pattern does not correspond exactly to the non-fractured one (Model-Based Mask Data Preparation, or MB-MDP, see in particular G. S. Chua et al. "Optimization of mask shot count using MB-MDP and lithography simulation", Proc. of SPIE, Vol. 8166, 816632-1-816632-11). This approach is complex to implement, and therefore slow and expensive.

"Jog alignment" is another shot-count reduction technique which consists in modifying the pattern before fracturing to remove misaligned jogs. A jog is a small (few nanometers) protruding or receding part in the edge of a pattern, usually created by the OPC. Misaligned jogs are jogs appearing on opposite edges of a feature but not directly facing each other. Said misaligned jogs would lead to the appearance, during fracturing, of small, sub-resolution elementary shapes, uselessly increasing the number of shots—see e.g. US 2009/0070732. This may result in a rather significant count reduction; however only a fraction of the sub-resolution features which could be removed harmlessly can be suppressed this way.

Use of L-shaped shots and multi-resolution writing (see the above-referenced paper by A. Elayat et al.) are also effective in reducing the shot count. However, the first requires a modification of the direct writing hardware, and the second of the writing process.

US 2014/245240 discloses a method wherein a first fracturing is performed and, if the fractured pattern is dimension-critical, a second fracturing is also performed.

US 2012/084740 discloses a fracturing method wherein the number of elementary shapes is reduced by using variable dose, different beam shape and by allowing overlapping of shots.

US 2012/329289 discloses, too, a method wherein the number of elementary shapes is reduced by allowing overlapping of shots.

SUMMARY OF THE INVENTION

The invention aims at providing a new shot-count reduction technique, more precise and relevant and/or simpler to implement than the known ones. Such a technique may replace or, preferably, complement, the shot-count reduction techniques of the prior art. According to the invention this result is obtained by introducing a step of suppressing some elementary shapes, chosen in such a way that the changes in the transferred pattern which result from the suppression remain within a given tolerance envelope.

An object of the present invention allowing achieving this aim is a method for transferring a fractured pattern, decomposed into elementary shapes, onto a substrate by direct writing by means of a particle or photon beam, including an exposure step, comprising exposing the substrate to a plurality of shots of a shaped particle or photon beam, each shot corresponding to an elementary shape, to obtain a transferred pattern on the surface of said substrate; characterized in that it comprises, before said exposure step:

a step of identifying at least one elementary shape of the fractured pattern, called removable elementary shape, whose removal induces modifications of the transferred pattern within a preset tolerance; and a step of removing said removable shape or shapes from the fractured pattern, to obtain a modified fractured pattern;

and in that, during said exposure step, each shot corresponds to an elementary shape of said modified fractured pattern.

According to different embodiments of the invention:

The method may further comprise a preliminary step of generating said fractured pattern by decomposing a pattern into elementary shapes.

The method may further comprise a step of modifying at least one elementary shape of the fractured pattern, adjacent to said or one said removable shape, in order to compensate for an effect of the removal of said removable shape on the pattern transferred onto the substrate.

Said step of modifying at least one elementary shape of the fractured pattern may include repositioning at least one of its edges to make said elementary shape to partially or totally overlap a void left by removal of said removable shape.

A particle or photon exposure dose m associated to each elementary shape of the fractured pattern, the method further comprising a step of modifying the exposure dose of at least one elementary shape adjacent to said or one said removable shape in order to compensate for an effect of the removal of said removable shape on the transferred pattern.

Said step of identifying at least one removable elementary shape may comprise applying a set of rules to a list of elementary shapes of the fractured pattern.

Said step of identifying at least one removable elementary shape may comprise: identifying a set of candidate elementary shapes; and for each candidate elementary shape, performing a local numerical simulation of said exposure step by considering the candidate elementary shape removed from the fractured pattern, performing a local comparison between a result of said simulation and a reference pattern; and labeling the candidate elementary shape as removable or not depending on a result of said comparison.

Said local numerical simulation may be performed by modifying at least one elementary shape adjacent to said candidate shape in order to compensate for an effect of the removal of said candidate shape on the pattern transferred onto the substrate.

The method may further comprise obtaining said reference pattern for each candidate elementary shape by performing a local numerical simulation of said exposure step without removing the candidate elementary shape from the fractured pattern.

Said comparison between a result of said simulation and a reference pattern may comprise checking that a contour of a simulated transferred pattern obtained by removing the candidate elementary shape from the fractured pattern lie within a tolerance envelope defined around a corresponding contour of a simulated transferred pattern obtained without removing the candidate elementary shape not from the fractured pattern.

Said comparison between a result of said simulation and a reference pattern may comprise checking that a dose distribution within a simulated transferred pattern obtained by removing the candidate elementary shape from the fractured pattern does not fall below a preset threshold.

Said identifying a set of candidate elementary shapes may comprise applying a set of rules to a list of elementary shapes of the fractured pattern.

Said beam may be an electron beam.

The method according may further comprise: before said exposure step, a step of depositing a resist layer on the substrate; and after said exposure step, a step of developing the resist layer.

Another object of the invention is a computer program product comprising computer-executable code, possibly stored on a computer-readable non-transitory medium, for causing a computer to carry out at least the step of identifying at least one removable elementary shape and the step of removing said removable shape or shapes of such a method.

The computer program may further comprise computer-executable code, also possibly stored on a computer-readable non-transitory medium, for causing a computer to drive a source of a particle or photon beam in order to carry out the exposure step of a method according to the invention.

BRIEF DESCRIPTION OF THE DRAWINGS

Additional features and advantages of the present invention will become apparent from the subsequent description, taken in conjunction with the accompanying drawings, wherein:

FIGS. 5a, 5b, 6a and 6b illustrate methods of performing the local comparison (or "consistency check") step of the method of FIG. 4.

DETAILED DESCRIPTION

Figure 2:
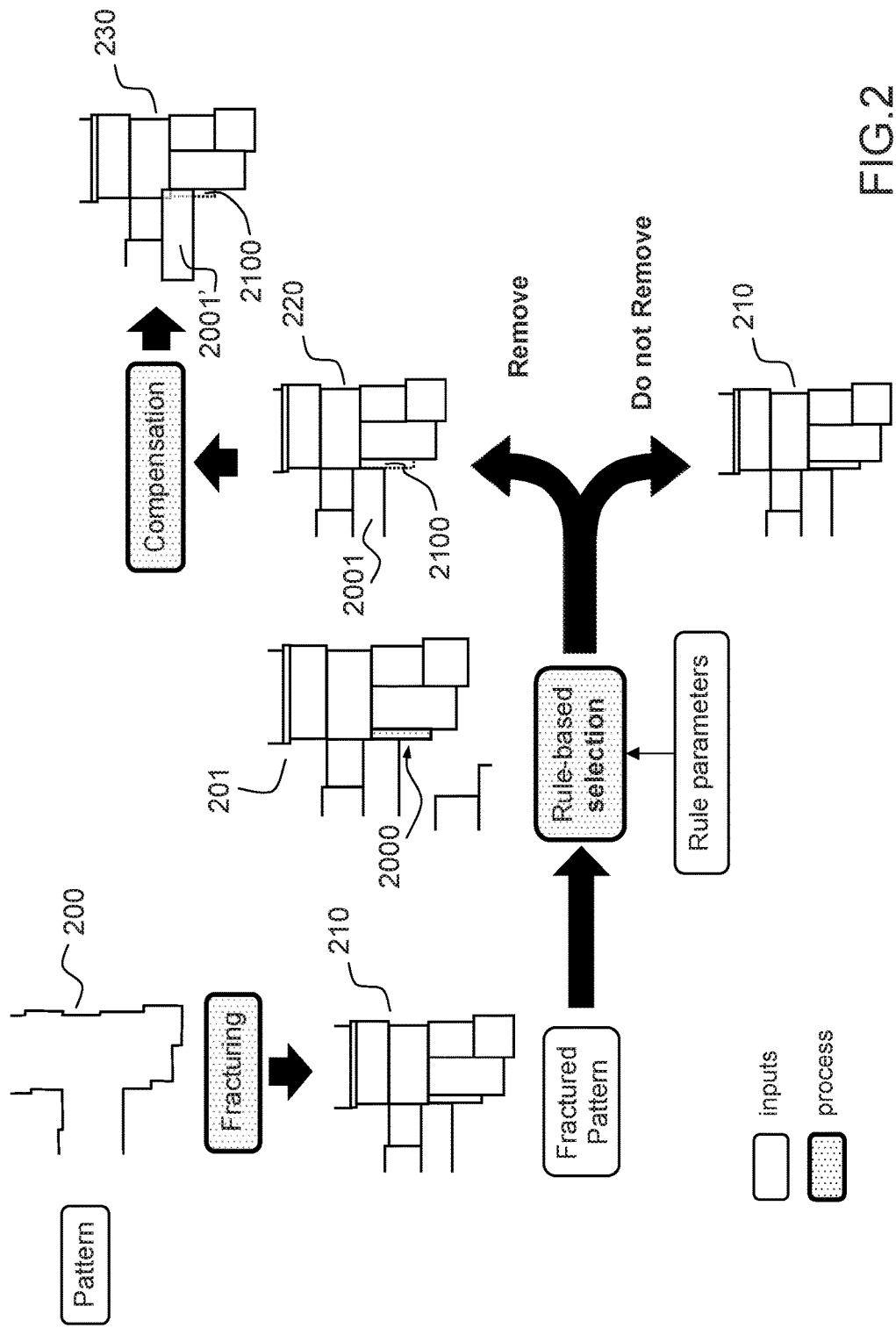
FIG. 2 illustrates a method according to a first embodiment of the invention.

According to a first embodiment of the invention, illustrated on FIG. 2, a pattern 200 to be transferred onto a substrate 10 is provided, typically in the form of a computer file in a suitable format, and fractured using fracturing algorithms known from the prior art. A rule-based selection, using suitable rule parameters, is then applied to the fractured pattern 210 (also in the form of a computer file) to identify removable elementary shapes. Otherwise stated, each elementary shape 2000 of the fractured pattern 200 is tested to check whether it complies with at least one of a set of predetermined rules, in which case it is removed; otherwise the elementary shape is kept (it is also possible to take removal as the default choice and use a complementary set of rules for identifying elementary shapes to be kept). Reference 220 identifies a fractured pattern modified by the removal of elementary shape 2000, which leaves a "void" 2100. Then, optionally, at least one elementary shape 2001, adjacent to the removed shape 2000, is modified in order to compensate for the removal of 2000 by filling, in whole or in part, the void 2100. In the example of FIG. 2, this is obtained by repositioning the right edge of shape 2001, shifting it toward the right; this way, the slightly enlarged shape 2001' partially overlaps with void 2100 (and, incidentally, with other elementary shapes of the fractured pattern). Removal compensation could also be performed by increasing the dose of shape 2001, which results in its broadening due to proximity effects.

It is important to note that the inventive method simplifies the already-fractured pattern, while the shot-count reduction methods known from the prior art are implemented before the fracturing step. This distinctive feature leads to a greater relevance and precision. Moreover the invention does not only consider the pattern contour, as e.g. the jog realignment method, but the shot themselves; therefore it is more closely related to the physics of direct writing, which further increases its relevance. Also, it is easy to combine the inventive method with the prior art: indeed, a known technique such as jog realignment can be applied before the fracturing step, and the inventive one after it.

Figure 3:
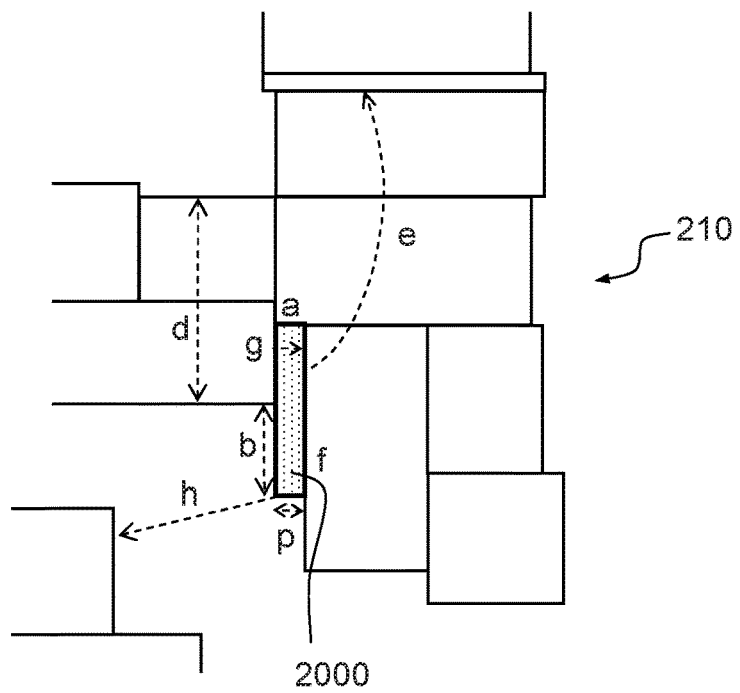
FIG. 3 illustrates an identification step of the method of FIG. 2.

FIG. 3 illustrates some possible rules which can be used to identify a removable shape:

1. Maximal height "a" lower (or lower or equal) than a preset value $a_0$, e.g. 5 nm.
2. Maximal jog length "b" lower (or lower or equal) than a preset value "$b_0$", e.g. 1000 nm.
3. Distance "c" from the pattern edge higher (or higher or equal) than a preset value "$c_0$", e.g. 2α, where α is the short-range point-spread function (PSF) of the particle or photon beam, i.e. the contribution of forward-scattering to its PSF. For electron-beam lithography, a is usually of the order of 30 nm, therefore $c_0$ may have a value of about 60 nm. In the example of FIG. 3, $c_0$=0, which allows removing shapes on the pattern edge. In the example, moreover, $c=c_0$=0 and parameter "c" is not represented.
4. Fraction "p" of the perimeter of the shape belonging to the edge of the pattern lower (or lower or equal) than a preset value "$p_0$", e.g. 20%.
5. Distance "h" of a peripheral elementary shape from the nearest neighboring pattern higher (or higher or equal) than a preset value "$h_0$", e.g. of the order of the critical dimension, which is typically 200 nm.
6. Minimal width "d" of the region of the pattern where the elementary shape is situated larger (or larger or equal) than a preset value "$d_0$", e.g. 200 nm. Narrower regions, which are usually generated by the OPC algorithm, should not be modified.
7. Surface "f" of the elementary shape lower, or lower or equal, than a preset value "$f_0$", e.g. 1000 nm$^2$.
8. Maximal length "g" of the translation of an edge of an adjacent elementary shape necessary to compensate for the removal, lower, or lower or equal, than a preset value "$g_0$", e.g. $a_0/1.5$.
9. Distance "e" of the closed elementary shape already recognized as "removable", smaller (or smaller or equal) than a preset value "$e_0$", e.g. 3α (typically about 90 nm). If two shapes, whose distance is lower than "$e_0$", are identified as being removable by applying the other rules, only one of them will be removed. The choice is preferably performed by identifying, on the basis of parameters a, b, etc., the shape whose removal is likely to have the least impact on the transferred pattern.
10. Elementary shape not belonging or to a critical region of the pattern. If an elementary shape belongs to a region which has been defined as critical, it cannot be removed even if it meets the requirements of all the other applicable rules.

Rules 1, 2, 6, 9 and 10 are particularly important. For instance, according to an embodiment of the invention, an elementary shape may be identified as being removable if rules 1 and 2 are satisfied. According to another, preferred, embodiment, the elementary shape is identified as being removable if rules 1, 2, 6 and 9 are satisfied. In an even more preferred embodiment, the elementary shape is only identified as being removable if rules 1, 2, 6, 9 and 10 are satisfied.

Other rules may involve the orientation of the elementary shape, a "criticality" of the pattern region, etc. Most of these rules involve geometrical parameters, but not necessarily all of them (cf. the case of the "criticality").

The simple rules above may be used in isolation or combined into more complex one using logical operators such as "AND", "OR", "EXCLUSIVE OR", "NOT". An exemplary complex rule, combining elementary rules 1, 2, 7 and the exclusion of critical regions, might be: "Remove all the elementary shapes with [($a<a_0$ OR $b>b_0$) AND ($f<f_0$) AND NOT (shape belongs to a critical region of the pattern)]".

The optimal set of rules and the numerical values or the rules parameter $a_0$, $b_0$ . . . depend on the direct writing technology and may be determined empirically, based on experience and/or numerical simulations.

It will be understood that many removable shapes will be "slivers", i.e. elementary shapes having at least one dimension comparable with the critical dimension (or resolution limit) of the direct writing technology; however, some elementary shapes may be removable even if they do not qualify as "slivers". Therefore, the inventive method may induce a greater shot-count reduction than e.g. jog alignment, which only prevents the formation of a particular subset of slivers.

Figure 4:
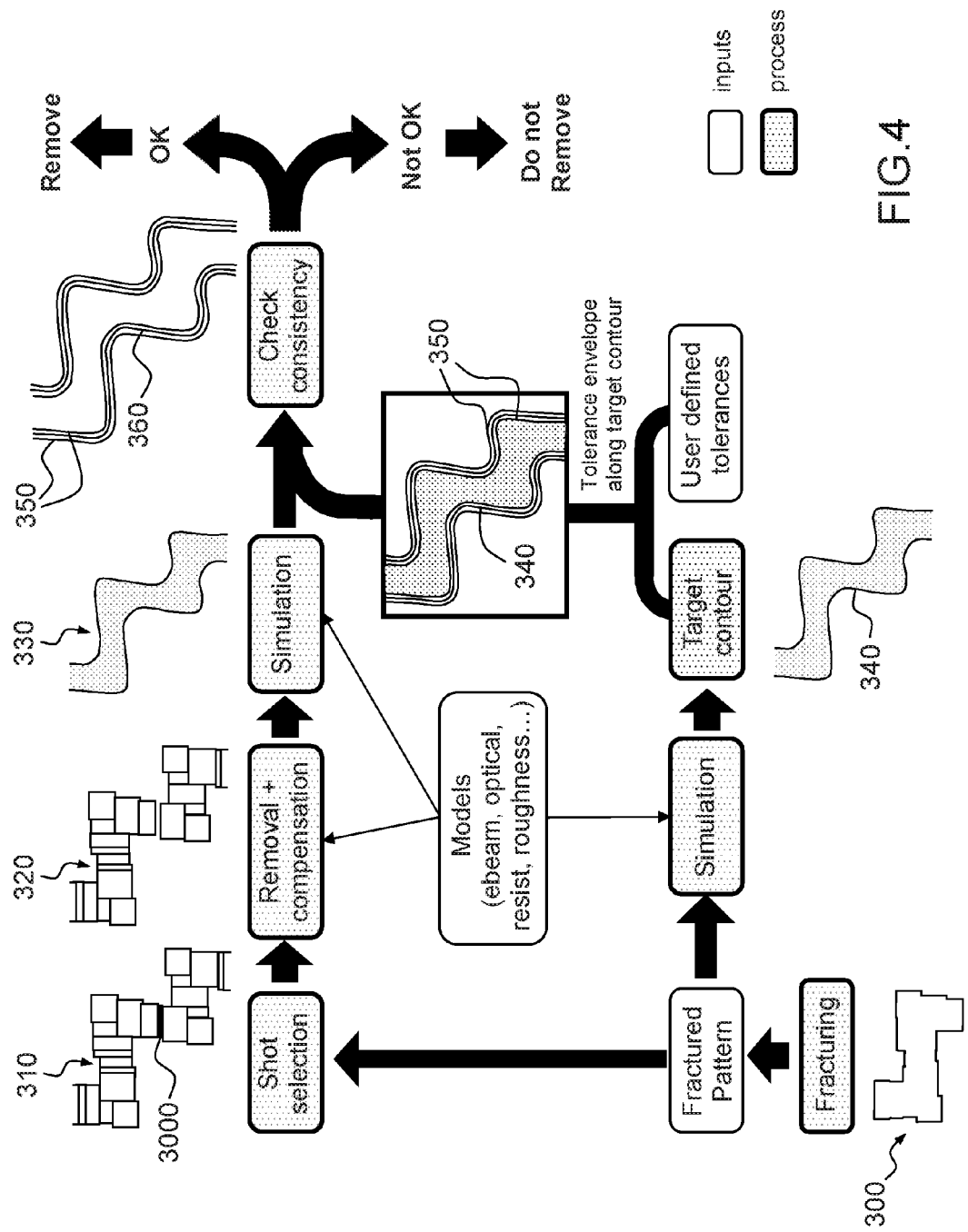
FIG. 4 illustrates a method according to a second embodiment of the invention.

FIG. 4 illustrates an alternative embodiment of the invention, based on numerical modeling of the direct writing process. As in the preceding embodiment, a pattern 300 is fractured, and then the elementary shapes 3000 of the resulting fractured pattern 310 are examined one by one. For each "candidate" elementary shape 3000, a modified pattern 320 is obtained by removing it from the fractured pattern 310, and optionally by compensating for the removal, as discussed above (the void left when the candidate elementary shape is removed is identified by reference 3100; no compensation is shown on the figure). Then, suitable numerical models of the electron beam propagation, of the electrons-substrate interaction, of the resist response, etc. are used to perform a "local" numerical simulation of the direct writing process, i.e. of the transfer of the modified pattern 320 onto the substrate. The simulation is qualified as "local" because it does not necessarily involve the whole fractured pattern, but may only concern a region centered on the candidate shape 3000 and extending over an area depending on the range of proximity effects (at least theoretically, a single global simulation could replace the multiple local simulations, but such an approach would require a huge computing power). The simulation result is a numerical representation 330 of a transferred pattern, from which a contour 360 can be extracted using conventional image processing algorithms.

A similar local simulation is performed, using the original fractured pattern and the same numerical models, to obtain a "reference" pattern from which a "target" contour 340 is extracted. User defined tolerances allow tracing a "tolerance envelope" 350 around said target contour. Then, it is checked whether the contour 360 corresponding to the modified fractured pattern is comprised within this tolerance envelope 350 ("consistency check"); the candidate shape 3000 is labeled as removable only in the affirmative.

Advantageously, the width of the tolerance envelope is not predetermined and uniform over the whole pattern, but is computed locally as a function of parameters such as:

the Edge Placement Error (EPE), i.e. the displacement of the edge pattern once transferred onto the resist;

the Energy Latitude (EL), expressing the sensitivity of the pattern to variations of the dose;

the Line Edge Roughness (LER), i.e. the deviation on an edge from an ideal line after the exposure step. One simple measure of the LER is the RMS (root mean square) deviation of an edge from the best fit straight line. It can be simulated using a "LER model" taking for example the dose and the EL as inputs.

Figure 5A:
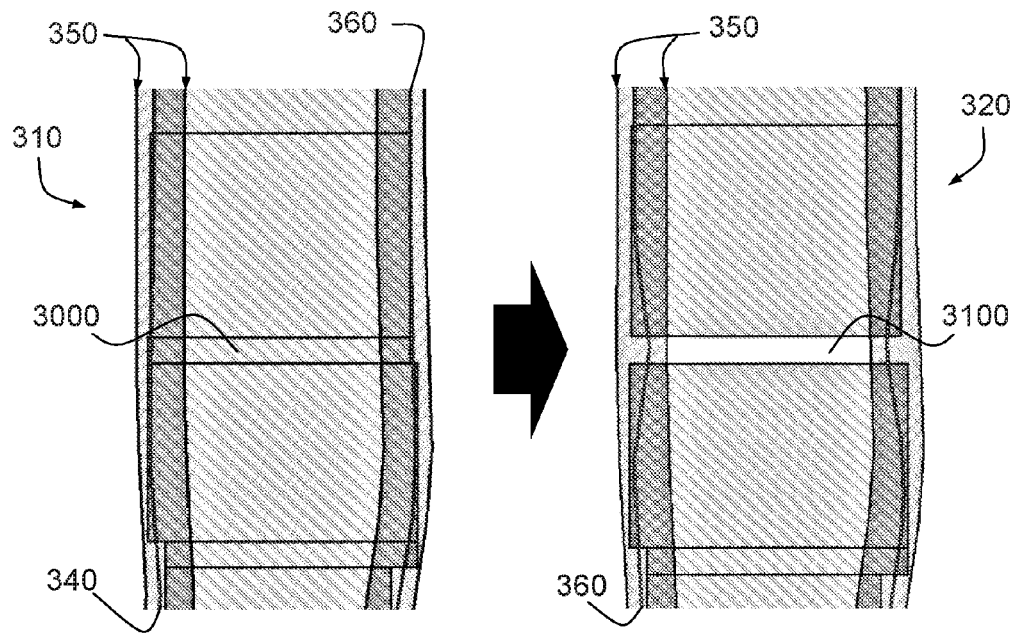

The left panel of FIG. 5A shows a portion of a fractured pattern 300 comprising a candidate shape 3000, the contour 340 of the corresponding transferred pattern and the associated tolerance envelope 350. The right panel of the figure shows the modified fractured pattern 320 obtained by removing candidate shape 3000, and the contour 360 of the corresponding transferred pattern. It can be seen that the modified contour 360 remains within the tolerance envelope 350: candidate shape 3000 is then considered removable.

Figure 5B:
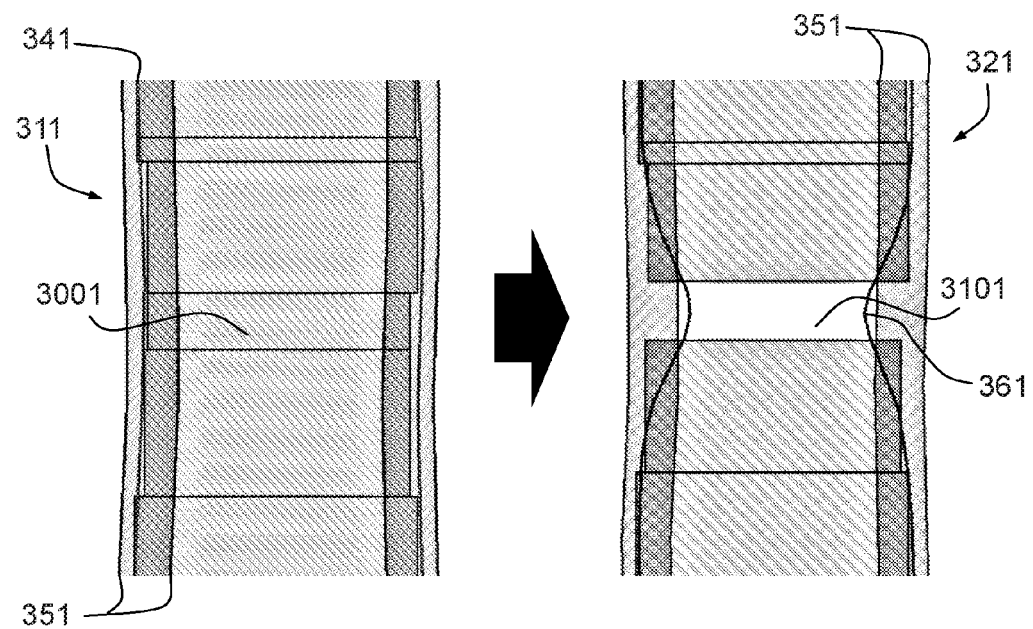

The left panel of FIG. 5B shows a portion of a slightly different fractured pattern 301, comprising a candidate shape 3001 which is larger than the candidate shape 3000 of FIG. 5A, the contour 341 of the corresponding transferred pattern and the associated tolerance envelope 351. The right panel of the figure shows the modified fractured pattern 321 obtained by removing candidate shape 3001, and the contour 361 of the corresponding transferred pattern. It can be seen that the modified contour 361 is not fully within the tolerance envelope 351: candidate shape 3001 is then considered non-removable.

Considering contours alone may not be sufficient to assess the removability of elementary shape, especially of those which are situated deep inside the pattern. A more satisfactory local comparison between the modified and reference transferred patterns also takes into account the spatial distribution of the dose, which may be computed using the numerical models, in particular to verify that it exceeds the resist threshold across the whole modified pattern. This is illustrated on FIGS. 6A and 6B. The left panel of FIG. 6A shows a portion of a fractured pattern comprising 10 slivers and 8 larger elementary shapes; the right panel shows the dose distribution across line AA': the dose is almost constant, well above the resist threshold TH. The left panel of FIG. 6B shows the corresponding portion of the modified fractured pattern obtained by removing the 10 slivers; the right panel shows the associated distribution: it is less uniform than in the case of FIG. 6A, but still well above the threshold, suggesting that the slivers are indeed removable.

In the rule-based embodiment (FIGS. 2 and 3) there is no consistency check. Instead the rules are chosen such that, in the vast majority of case, the removal of selected elementary shapes will induce modifications of the transferred pattern within a preset tolerance.

The embodiments of FIGS. 2-3 and 4 are not mutually exclusive and can advantageously be combined. For instance, a rule-based approach (cf. FIG. 2) may be used to pre-select candidate shapes whose removability is checked using a more accurate—but much more computationally intensive—model-based approach (cf. FIG. 4). In a simpler implementation, the pre-selection step only excludes elementary shapes belonging to particularly sensible zones of the pattern.

Figure 1:
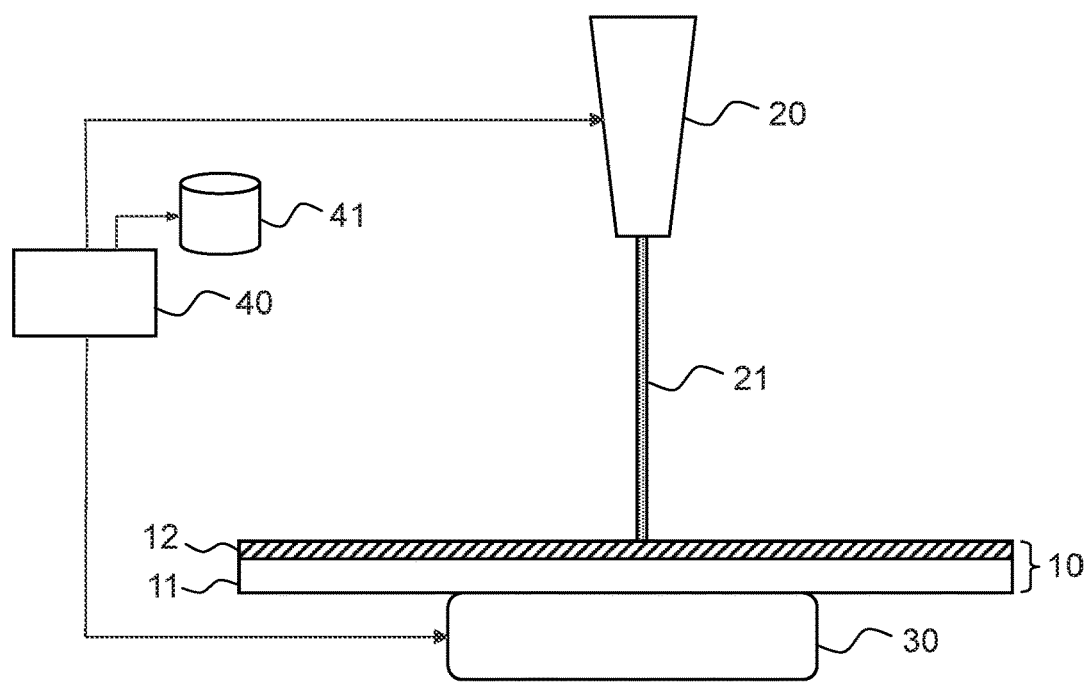
FIG. 1, described above, is a schematic illustration of an electron-beam lithography method and apparatus known from prior art.

The inventive method is typically implemented by executing a suitable program on a computer. Said computer may directly drive the EBL apparatus (cf. computer or processor 40 on FIG. 1) or simply produce data to be provided to the EBL apparatus. The program comprises instruction code for fracturing an input pattern (or receiving as its input an already-fractured pattern), for identifying removable elementary shapes using one of the methods described above and for outputting a modified fractured pattern obtained by removing the elementary shapes identified as being removable. It may also comprise instruction code for driving the EBL apparatus accordingly.

The program itself, the file(s) representing the pattern(s), the rule parameters (for the embodiment of FIGS. 2 and 3), the model and tolerance data (for embodiment of FIG. 4) may be stored on the same or on different, and possibly remote, computer-readable storage media. For example, the program and the files mentioned above may be stored in the memory device 41 of the processor of FIG. 1.

The invention claimed is:

1. A method for transferring a fractured pattern, decomposed into elementary shapes, onto a substrate by direct writing by means of a particle or photon beam, including an exposure step, comprising exposing the substrate to a plurality of shots of a shaped particle or photon beam, each shot corresponding to an elementary shape, to obtain a transferred pattern on the surface of said substrate;

comprising, before said exposure step:

a step of identifying at least one elementary shape of the fractured pattern, called removable elementary shape, whose removal induces modifications of the transferred pattern within a preset tolerance, wherein said step of identifying at least one removable elementary shape comprises applying a set of rules to a list of elementary shapes of the fractured pattern, wherein at least some of said rules define criteria which have to be met for an elementary shape to be identified as being removable, including at least one of the following:

maximal height of the elementary shape lower or lower or equal than a preset value;

maximal jog length lower, or lower or equal, than a preset value;

distance of the elementary shape from the pattern edge higher, or higher or equal, than a preset value;

fraction of the perimeter of the elementary shape belonging to the edge of the pattern lower, or lower or equal, than a preset value;

distance of a peripheral elementary shape from the nearest neighboring pattern higher, or higher or equal, than a preset value;

minimal width "d" of the region of the pattern where the elementary shape is situated larger, or larger or equal, than a preset value;

surface of the elementary shape lower, or lower or equal, than a preset value;

maximal length of the translation of an edge of the adjacent elementary shape necessary to compensate for the removal, lower or lower or equal, than a preset value;

distance of the closed elementary shape already recognized as "removable," smaller, or smaller or equal, than a preset value: and elementary shape not belonging to a critical region of the pattern; and a step of removing said removable shape or shapes from the fractured pattern, to obtain a modified fractured pattern; and wherein, during said exposure step, each shot corresponds to an elementary shape of said modified fractured pattern from which said removable shape or shapes have been removed.

2. The method according to claim 1, further comprising a preliminary step of generating said fractured pattern by decomposing a pattern into elementary shapes.

3. The method according to claim 1, further comprising a step of modifying at least one elementary shape of the fractured pattern, adjacent to said or one said removable shape, in order to compensate for an effect of the removal of said removable shape on the pattern transferred onto the substrate.

4. The method according to claim 3 wherein said step of modifying at least one elementary shape of the fractured pattern includes repositioning at least one of its edges to make said elementary shape to partially or totally overlap a void left by removal of said removable shape.

5. The method according to claim 3 wherein a particle or photon exposure dose is associated to each elementary shape of the fractured pattern, the method further comprising a step of modifying the exposure dose of at least one elementary shape adjacent to a removable shape in order to compensate for an effect of the removal of said removable shape on the transferred pattern.

6. The method according to claim 1 wherein an elementary shape is only identified as being removable when at least all of the following criteria are met:

maximal height of the elementary shape lower or lower or equal than a preset value;

maximal jog length lower, or lower or equal, than a preset value;

minimal width "d" of the region of the pattern where the elementary shape is situated larger, or larger or equal, than a preset value; and distance of the closed elementary shape already recognized as "removable," smaller, or smaller or equal, than a preset value.

7. The method according to claim 6 wherein an elementary shape is only identified as being removable when the elementary shape does not belong to a critical region of the pattern.

8. The method according to claim 1 wherein said step of identifying at least one removable elementary shape comprises:

identifying a set of candidate elementary shapes; and for each candidate elementary shape, performing a local numerical simulation of said exposure step by considering the candidate elementary shape removed from the fractured pattern, performing a local comparison between a result of said simulation and a reference pattern; and labeling the candidate elementary shape as removable or not depending on a result of said comparison.

9. The method according to claim 8, further comprising a step of modifying at least one elementary shape of the fractured pattern, adjacent to said or one said removable shape, in order to compensate for an effect of the removal of said removable shape on the pattern transferred onto the substrate, wherein said local numerical simulation is performed by modifying at least one elementary shape adjacent to said candidate shape in order to compensate for an effect of the removal of said candidate shape on the pattern transferred onto the substrate.

10. The method according to claim 8, further comprising obtaining said reference pattern for each candidate elementary shape by performing a local numerical simulation of said exposure step without removing the candidate elementary shape from the fractured pattern.

11. The method according to claim 8 wherein said comparison between a result of said simulation and a reference pattern comprises checking that a contour of a simulated transferred pattern obtained by removing the candidate elementary shape from the fractured pattern lie within a tolerance envelope defined around a corresponding contour of a simulated transferred pattern obtained without removing the candidate elementary shape not from the fractured pattern.

12. The method according to claim 8 wherein said comparison between a result of said simulation and a reference pattern comprises checking that a dose distribution within a simulated transferred pattern obtained by removing the candidate elementary shape from the fractured pattern does not fall below a preset threshold.

13. The method according to claim 8 wherein said identifying a set of candidate elementary shapes comprises applying a set of rules to a list of elementary shapes of the fractured pattern.

14. The method according to claim 1 wherein said beam is an electron beam.

15. The method according to claim 1, further comprising:

before said exposure step, a step of depositing a resist layer on the substrate; and after said exposure step, a step of developing the resist layer.

16. A non-transient computer program product comprising computer-executable code for causing a computer to carry out at least:

the step of identifying at least one removable elementary shape; and the step of removing said removable shape or shapes of a method according to claim 1.

* * * * *